United States Patent
Choi et al.

(10) Patent No.: US 6,317,472 B1
(45) Date of Patent: Nov. 13, 2001

(54) VITERBI DECODER

(75) Inventors: Sung-han Choi, Suwon; Jun-jin Kong, Seongnam, both of (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/129,900

(22) Filed: Aug. 6, 1998

(30) Foreign Application Priority Data

Aug. 7, 1997 (KR) .................................................. 97-37799

(51) Int. Cl.[7] ...................................................... H03D 1/00
(52) U.S. Cl. .......................... 375/341; 375/262; 714/794; 714/795; 714/796
(58) Field of Search ................................... 375/262, 265, 375/341, 340; 714/794, 795, 796, 759, 767, 781

(56) References Cited

U.S. PATENT DOCUMENTS

| | | | |
|---|---|---|---|
| 5,272,706 | * 12/1993 | Park | 714/795 |
| 5,559,837 | * 9/1996 | Blaker et al. | 375/341 |
| 5,923,713 | * 7/1999 | Hatakeyama | 375/341 |
| 5,946,361 | * 8/1999 | Araki et al. | 375/341 |
| 5,960,011 | * 9/1999 | Oh | 375/262 |
| 6,041,433 | * 3/2000 | Kamada | 714/795 |

FOREIGN PATENT DOCUMENTS

| | | | |
|---|---|---|---|
| 2 311 447 A | 9/1997 | (GB) | H03M/13/00 |
| 60-183824 | 9/1985 | (JP) | H03M/13/12 |
| 61-62235 | 3/1986 | (JP) | H03M/13/12 |
| 96/31953 | 10/1996 | (WO) | H03M/13/00 |

* cited by examiner

*Primary Examiner*—Chi Pham
*Assistant Examiner*—Emmanuel Bayard
(74) *Attorney, Agent, or Firm*—Sughrue, Mion, Zinn, Macpeak & Seas, PLLC

(57) ABSTRACT

An apparatus for providing and storing a state metric which is used for an add-compare-select (ACS) operation in a Viterbi decoder using a number of ACS units in order to enhance decoding speed. A state metric memory in Viterbi decoder uses a two-port memory, in which a memory bank for reading and writing a state metric of a first half among the N state metrics generated in a ACS unit and two memory banks for alternately reading and writing the state metric of the second half whenever a codeword is input, are incorporated into a single memory. As a result, the storage capacity for storing the state metrics can be greatly reduced as compared to a conventional apparatus.

4 Claims, 9 Drawing Sheets

| SMM_A | | SMM_B | | SMM_E | | SMM_F | |
|---|---|---|---|---|---|---|---|
| SM0 | | SM1 | | SM2 | | SM3 | |
| SM4 | | SM5 | | SM6 | | SM7 | |
| SM8 | | SM9 | | SM10 | | SM11 | |
| ... | | ... | | ... | | ... | |
| SM120 | | SM121 | | SM122 | | SM123 | |
| SM124 | | SM125 | | SM126 | | SM127 | |

| SMM_C | | SMM_D | | SMM_G | | SMM_H | |
|---|---|---|---|---|---|---|---|
| SM128 | | SM129 | | SM130 | | SM131 | |
| SM132 | | SM133 | | SM134 | | SM135 | |
| SM136 | | SM137 | | SM138 | | SM139 | |
| ... | | ... | | ... | | ... | |
| SM248 | | SM249 | | SM250 | | SM251 | |
| SM252 | | SM253 | | SM254 | | SM255 | |

VITERBI DECODER

BACKGROUND OF THE INVENTION

1. Field of the Invention

The present invention relates to a Viterbi decoder, and more particularly, to an apparatus configuration for supplying and storing a state metric used during add-compare-select (ACS) operations in a Viterbi decoder that uses a number of ACS units to enhance decoding speed.

2. Description of the Related Art

A Viterbi decoder is an apparatus that decodes codewords, encoded by a convolutional code, by using a maximum likelihood method. The Viterbi decoder compares an encoding state of a predetermined encoder with that of a received codeword, selects the closest encoding path, and decodes information transmitted from the selected path.

FIG. 1 is a block diagram showing a conventional Viterbi decoder. The Viterbi decoder shown in FIG. 1 includes a branch metric calculator 10, an ACS unit 12, a state metric memory 14, a path memory 16, and a path tracing logic unit 18.

When the apparatus shown in FIG. 1 receives a codeword, the branch metric calculator 10 calculates the similarity (Hamming distance) between the received codeword and a predetermined codeword, which can be output from an encoder (not shown), and outputs a branch metric BM. The ACS unit 12 receives the branch metric BM provided from the branch metric calculator 10 and a previous (old) state metric OSM stored in the state metric memory 14 as inputs, and performs an add-compare operation to select a survival path showing an encoding sequence closest to that of the received codeword and calculate a current (new) state metric NSM of the survival path. The selected survival path is stored in the path memory 16 and the calculated current state metric NSM is stored in the state metric memory 14. The path tracing logic unit 18 refers to the survival path memory in the path memory 16 and outputs decoded data based on an encoding path of the received codeword.

The number of states N which can exist for a single codeword, among the received codewords in Viterbi decoding, is defined as $2^{K-1}$, where K is defined as a constraint length. When the ACS unit 12 of FIG. 1, which calculates the state metric of the survival path, has N number of states, the apparatus shown in FIG. 1 maintains the fastest processing speed. This is because N ACS units each simultaneously perform an ACS operation, with respect to the N states which can exist in correspondence to a single codeword.

Therefore, with respect to decoding speed, it is preferable that N ACS units be used for codeword having N states. However, it is difficult to make a large capacity ACS unit. Thus, as the state number N becomes larger, the number of ACS units must be selected appropriately.

A convolutional code having a constraint length K of 9 is used in a general code division multiple access (CDMA) system, therefore, the state number becomes 256 ($2^{a-1}$). If a Viterbi decoder uses 256 ACS units, decoding speed is fast, but more hardware is required. However, when a single ACS unit is used in a Viterbi decoder, less hardware is required, but decoding speed is slow.

A Viterbi decoder using a single ACS unit is disclosed in Korean patent application No. 90-20808 filed on Dec. 17, 1990, by the same applicants, entitled "State metric storage device". This device can perform fast input and output processing of a state metric when a single ACS unit is used, but cannot be used when a number of ACS units are used.

A technology for enhancing decoding speed using a number of ACS units is disclosed in Korean patent application No. 96-7208 filed on Mar. 18, 1996, by the same applicants, entitled "ACS device of Viterbi decoder". This device uses four ACS units to enhance decoding speed. However, since the device includes a typical state metric memory, that is comprised of a single memory device, the input and output speed of the state metric are somewhat slow.

A technology for solving the above problems is disclosed in Korean patent application No. 97-8603, filed on Mar. 14, 1997, by the same applicants, entitled "State metric storing method and apparatus for Viterbi decoder". This apparatus uses two-state metric storing units that are comprised of two memory devices, to efficiently supply and store the state metric used during add-compare-select operations. However, since a memory capacity of 2N is required, where N is the number of states, the memory capacity of the state metric storing unit becomes larger as N increases, which is burdensome.

SUMMARY OF THE INVENTION

To solve the above problems, it is an objective of the present invention to provide a small capacity Viterbi decoder that uses a number of ACS units to enhance decoding speed that can supply and store a state metric.

To achieve the above objective, there is provided a Viterbi decoder comprising: a state metric storing portion that has a single memory bank for reading and writing a state metric of a first half; and two memory banks for reading and writing the state metric of the second half alternately, whenever a codeword is applied; wherein the state metric storing portion is comprised of a single two-port memory, which is used by all of the add-compare-select units.

Thus, because a memory for storing a state metric of a first half is not used, storage capacity for storing the state metrics is greatly reduced when compared with a conventional apparatus.

BRIEF DESCRIPTION OF THE DRAWINGS

The above objectives and advantages of the present invention will become more apparent by describing in detail a preferred embodiment with reference to the attached drawings in which:

FIGS. 3A and 3B are trellis diagrams for explaining the operation of the apparatus shown in FIGS. 1 and 2, when a constraint length is 9;

FIG. 7 shows a configuration of the state metric storing portion shown in FIG. 2;

DESCRIPTION OF THE PREFERRED EMBODIMENTS

The structure and effect of the present invention will be described below with reference to the drawings.

Figure 2:
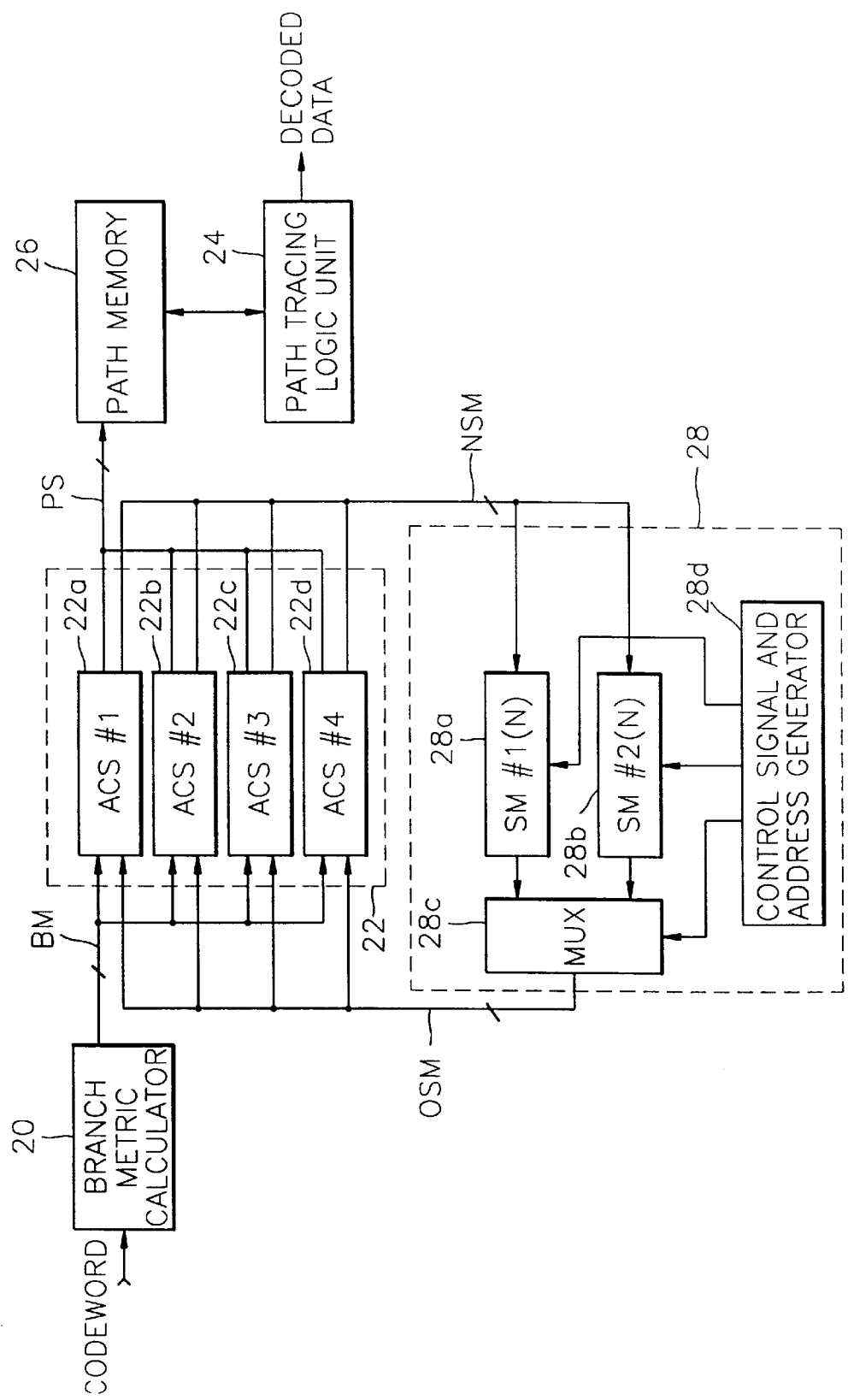
FIG. 2 is a block diagram of another conventional Viterbi decoder.

Another conventional Viterbi decoder is shown in FIG. 2 and disclosed in Korean patent application 97-8603. It includes a branch metric calculator 20, an ACS unit 22 that has four ACS units 22a–22d, a state metric memory 28 that has two memories 28a and 28b, a path memory 26, and a path tracing logic unit 24.

The ACS unit 22 includes four ACS units 22a–22d. Each of the ACS units 22a–22d performs an ACS operation with respect to N/4 states. Since the number of states is 256 when the code ratio is 1/3 and the constraint length is 9, each of the ACS units 22a–22d performs an ACS operation 64 times (256/4). The ACS unit 22 calculates four current state metrics with reference to four previous state metrics and eight branch metrics for each cycle of the 64 cycles.

Figure 1:
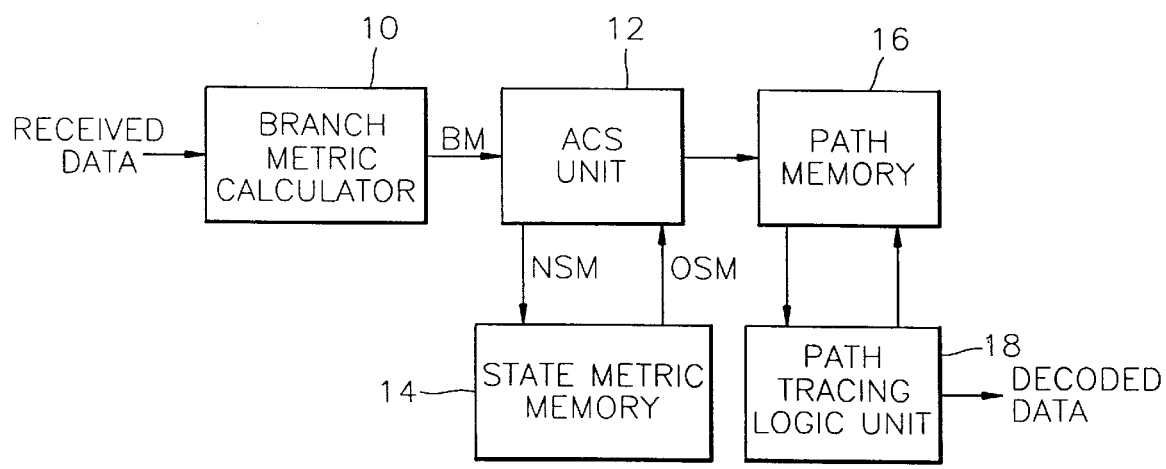
FIG. 1 is a block diagram of a conventional Viterbi decoder.
Figure 3A:
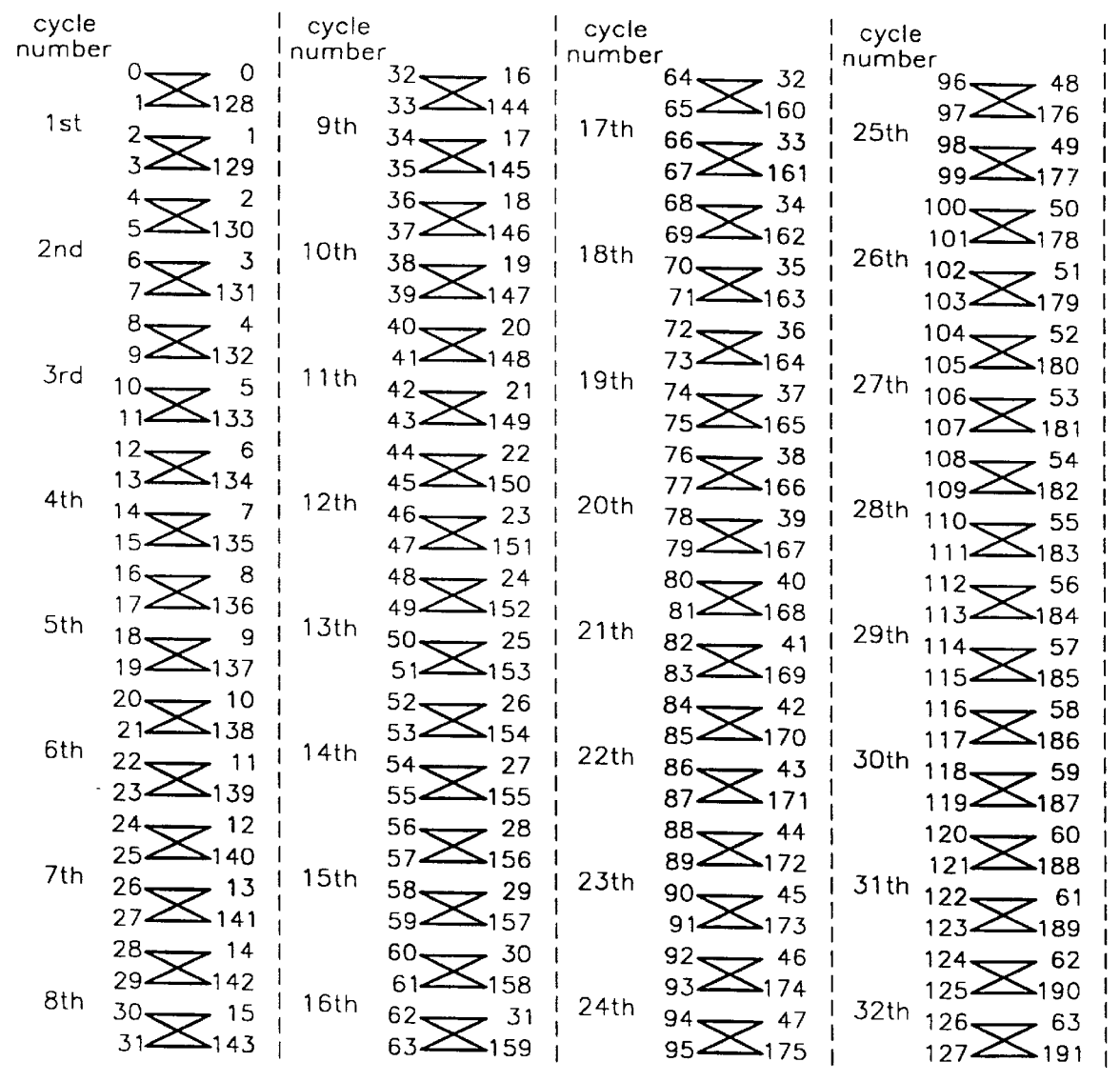
Figure 3B:
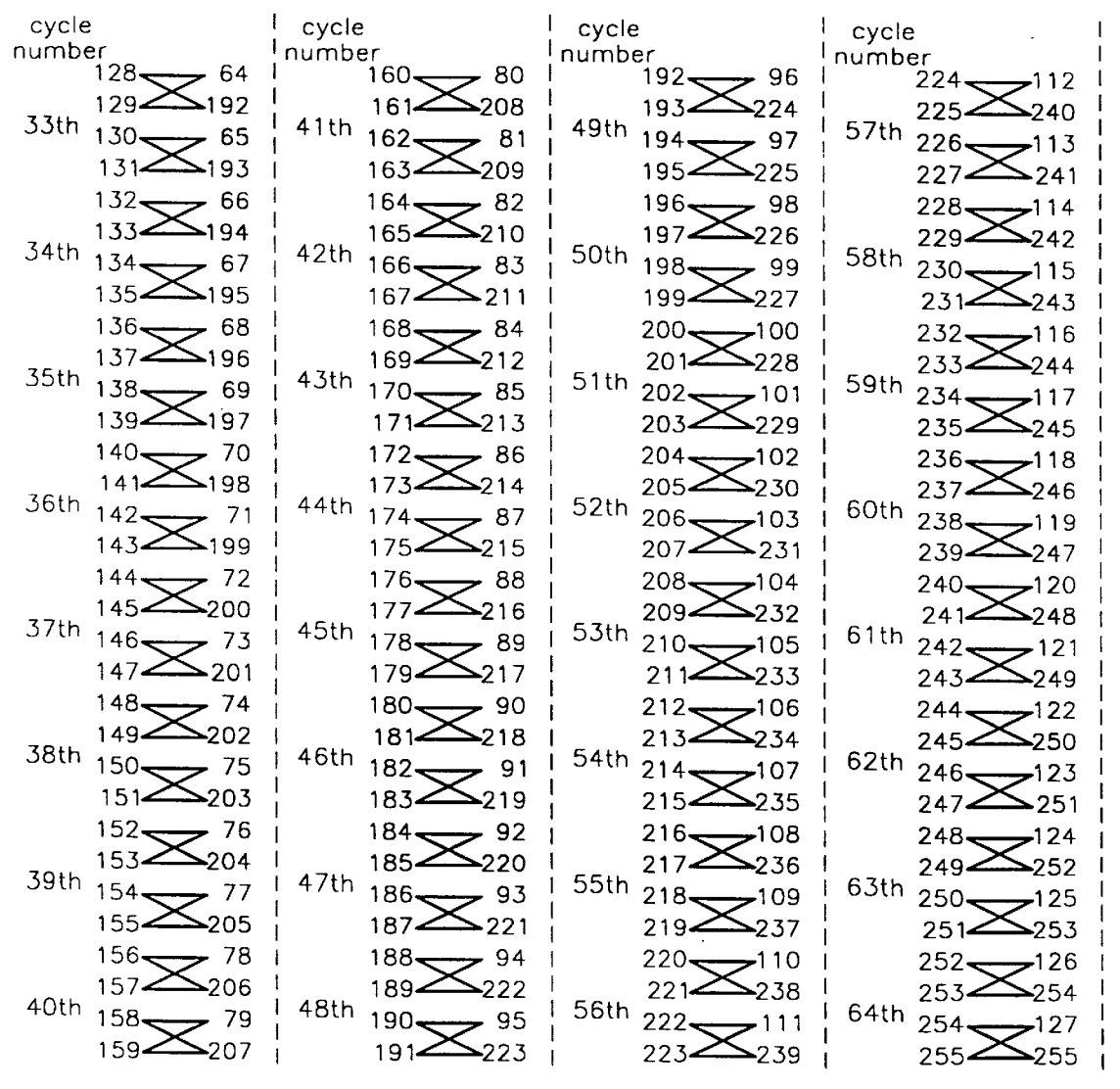

FIG. 3A and 3B are trellis diagrams for explaining the operation of the apparatuses shown in FIGS. 1 and 2. It is well known that the number of states that can be shifted whenever an information bit is input, is limited to two at the stable state of a convolutional encoder, and a state to be shifted is consistent. For example, in the case of the apparatuses shown in FIGS. 1 and 2, the 0th state can be shifted only to the 0th state or the 128th state and the second state can be shifted only to the first state or the 129th state.

In each column divided by dotted lines shown in FIGS. 3A and 3B, the left-hand numbers represent the previous states and the right-hand numbers represent the current states. The solid lines connecting the states represent the branch metrics between the previous and current states. For example, the solid line connecting the previous 0th state with the current 0th state represents the branch metric between both the states.

In the upper-left portion of FIG. 3A, a value obtained by adding a state metric with respect to the previous 0th state, and a branch metric between the previous 0th state and the current 0th state, is compared with a value obtained by adding a state metric with respect to the previous 1st state, and a branch metric between the previous 1st state and the current 0th state. The smaller of the two values is taken as a state metric with respect to the current 0th state.

Also, a value obtained by adding a state metric with respect to the previous 0th state, and a branch metric between the previous 0th state and the current 128th state, is compared with a value obtained by adding a state metric with respect to the previous 1st state, and a branch metric between the previous 1st state and the current 128th state. The smaller of the two values is taken as a state metric with respect to the current 128th state.

The ACS unit 22 calculates the state metrics with respect to the current 0th, 128th, 1st and 129th states by referring to the state metrics with respect to the previous 0th through 3rd states and eight branch metrics at the first cycle among the 64 cycles, if a single codeword is input.

The ACS unit 22a calculates the state metric with respect to the current 0th state by referring to the state metric with respect to the previous 0th and 1st states and the two branch metrics.

The ACS unit 22b calculates the state metric with respect to the current 128th state by referring to the state metric with respect to the previous 0th and 1st states and the two branch metrics.

The ACS unit 22c calculates the state metric with respect to the current 1st state by referring to the state metric with respect to the previous 2nd and 3rd states and the two branch metrics.

The ACS unit 22d calculates the state metric with respect to the current 129th state by referring to the state metric with respect to the previous 2nd and 3rd states and the two branch metrics.

Then, the ACS unit 22 calculates the state metrics with respect to the current 2nd, 130th, 3rd and 131st states by referring to the state metrics with respect to the previous 4th, 5th, 6th and 7th states and the eight branch metrics at the second cycle.

The ACS unit 22a calculates the state metric with respect to the current 2nd state by referring to the state metric with respect to the previous 4th and 5th states and the two branch metrics.

The ACS unit 22b calculates the state metric with respect to the current 130th state by referring to the state metric with respect to the previous 4th and 5th states and the two branch metrics.

The ACS unit 22c calculates the state metric with respect to the current 3rd state by referring to the state metric with respect to the previous 6th and 7th states and the two branch metrics.

The ACS unit 22d calculates the state metric with respect to the current 131st state by referring to the state metric with respect to the previous 6th and 7th states and the two branch metrics.

The ACS unit 22 repeats the above operations until it obtains the state metric with respect to the current 126th, 254th, 127th and 255th states by referring to the state metric with respect to the previous 252nd, 253rd, 254th and 255th states and the eight branch metrics.

This operation can be generally expressed by stating that the ACS unit 22 calculates the state metric with respect to the current ith, (N/2+i)th, (i+1)th and (N/2+i+1)th states by referring to the state metric with respect to the previous 2ith, (2i+1)th, 2(i+1)th and {2(i+1)+1}th states and the eight branch metrics at each cycle.

Here, BM0 is a branch metric from the previous 2ith state to the current ith state.

BM1 is a branch metric from the previous 2ith state to the current (N/2+i)th state.

BM2 is a branch metric from the previous (2i+1)th state to the current ith state.

BM3 is a branch metric from the previous (2i+1)th state to the current (N/2+i)th state.

BM4 is a branch metric from the previous 2(i+1)th state to the current (i+1)th state.

BM5 is a branch metric from the previous 2(i+1)th state to the current (N/2+i+1)th state.

BM6 is a branch metric from the previous {2(i+1)+1}th state to the current (i+1)th state.

BM7 is a branch metric from the previous {2(i+1)+1}th state to the current (N/2+i+1)th state.

Figure 4:
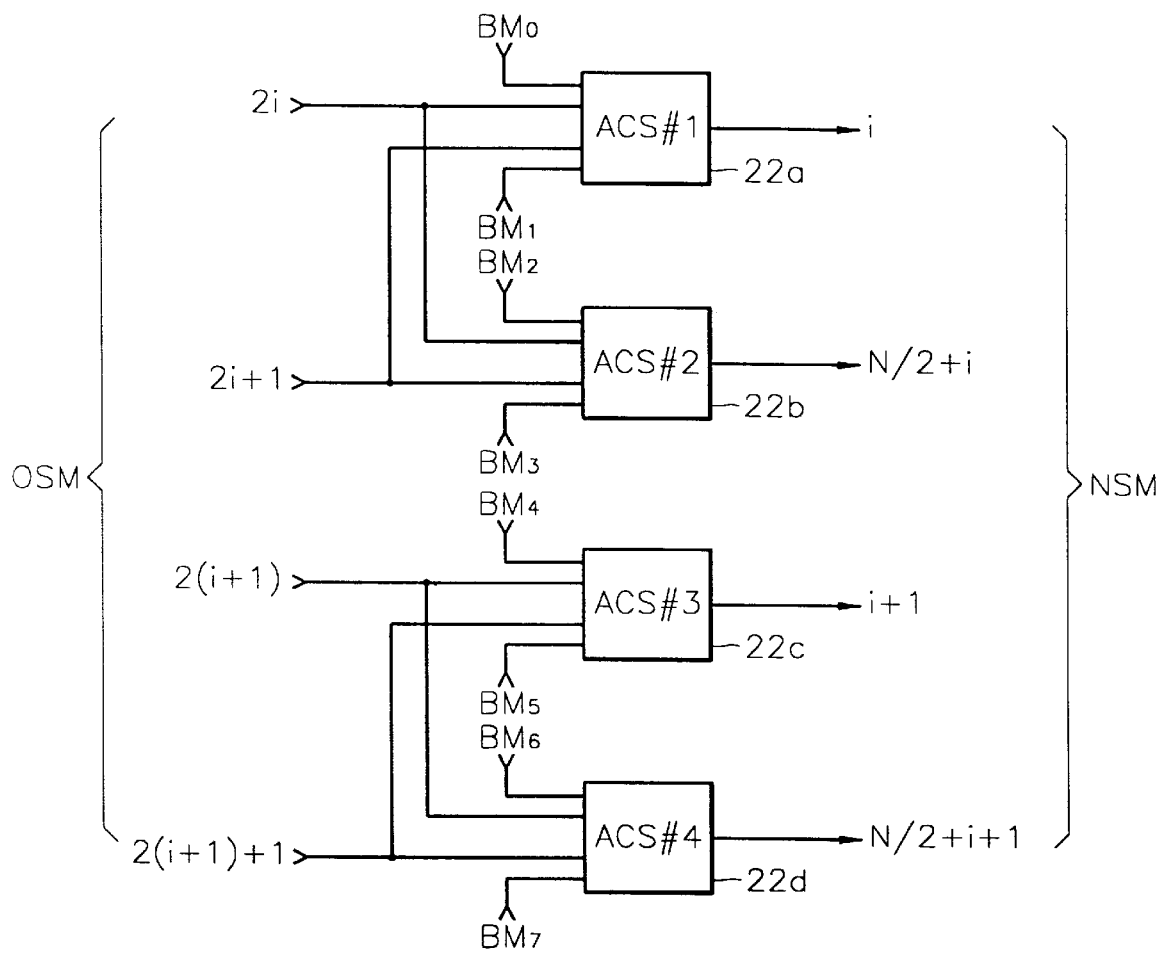
FIG. 4 is a diagram explaining the operation of the add-compare-select portion shown in FIG. 2.

FIG. 4 is a conceptual view that explains the operation of the add-compare-select portion shown in FIG. 2. Referring to FIG. 4, the ACS unit 22 calculates the state metrics with respect to the current ith, (N/2+i)th, (i+1)th and (N/2+i+1)th states by referring to the state metrics with respect to the previous 2ith, (2i+1)th, 2(i+1)th and {(2(i+1)+1}th states and the branch metrics BM0–BM7 at each cycle among 64 cycles, if a single codeword is input.

The ACS unit 22a calculates the state metric with respect to the current ith state by referring to the state metric with respect to the previous 2ith and (2i+1)th states and the two branch metrics $BM_0$ and $BM_2$.

The ACS unit 22b calculates the state metric with respect to the current (N/2+i)th state by referring to the state metric with respect to the previous 2ith and (2i+1)th states and the two branch metrics $BM_1$ and $BM_3$.

The ACS unit 22c calculates the state metric with respect to the current (i+1)th state by referring to the state metric with respect to the previous 2(i+1)th and {2(i+1)+1}th states and the two branch metrics $BM_4$ and $BM_6$.

The ACS unit 22d calculates the state metric with respect to the current (N/2+i+1)th state by referring to the state metric with respect to the previous 2(i+1)th and {2(i+1)+1}th states and the two branch metrics $BM_5$ and $BM_7$.

Figure 5:
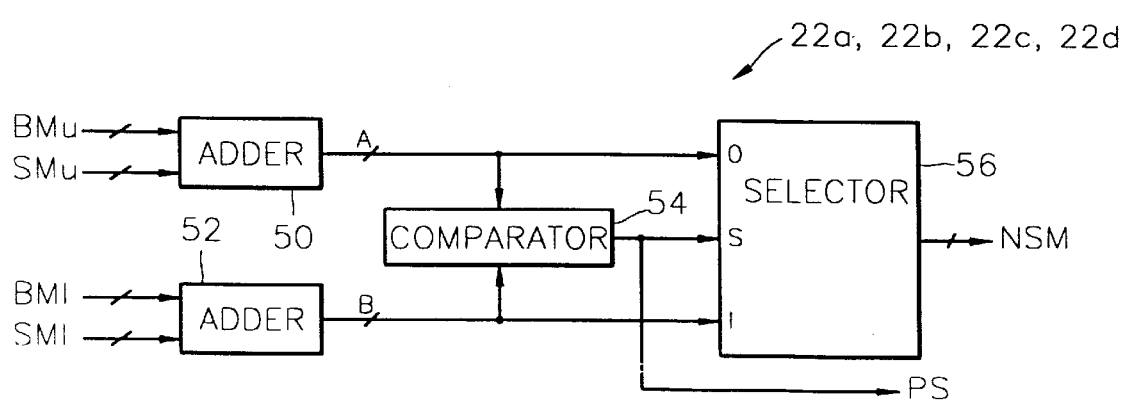
FIG. 5 is a detailed block diagram showing the add-compare-select portion shown in FIG. 2.

FIG. 5 is a block diagram showing in detail the add-compare-select portion shown in FIG. 2. The apparatus shown in FIG. 5 includes two adders 50 and 52, a comparator 54 and a selector 56.

The adder 50 adds a branch metric applied to a BMu port and a previous state metric applied to a SMu port, and outputs a signal "A". Meanwhile, the adder 52 adds a branch metric applied to a BMl port and a previous state metric applied to a SMl port, and outputs a signal "B". The comparator 54 compares the signal "A" from the adder 50 with the signal "B" from the adder 52, and outputs a low-level path select signal PS if A≦B and outputs a high-level path select signal PS if A>B.

The selector 56 selects either the signal "A" from the adder 50 or the signal "B" from the adder 52, in response to the path select signal PS output from the comparator 54, and outputs a current state metric NSM.

Each of the ACS units 22a–22d performs the operation of an input codeword 64 times. The first ACS unit 22a and the second ACS unit 22b perform the operation with respect to the even-numbered current state metrics, and the third ACS unit 22c and the fourth ACS unit 22d perform the operation with respect to the odd-numbered current state metrics.

In more detail, the first ACS unit 22a calculates the state metric with respect to the uppermost 0th, 2nd, 4th, . . . , 124th and 126th states among the even-numbered current state metrics. The second ACS unit 22b calculates the state metric with respect to the lowermost 128th, 130th, 132nd, . . . , 252nd and 254th states among the even-numbered current state metrics. The third ACS unit 22c calculates the state metric with respect to the uppermost 1st, 3rd, 5th, . . . , 125th and 127th states among the odd-numbered current state metrics. The fourth ACS unit 22d calculates the state metric with respect to the uppermost 129th, 131st, 133rd, . . . , 253rd and 255th states among the odd-numbered current state metrics.

Figure 6:
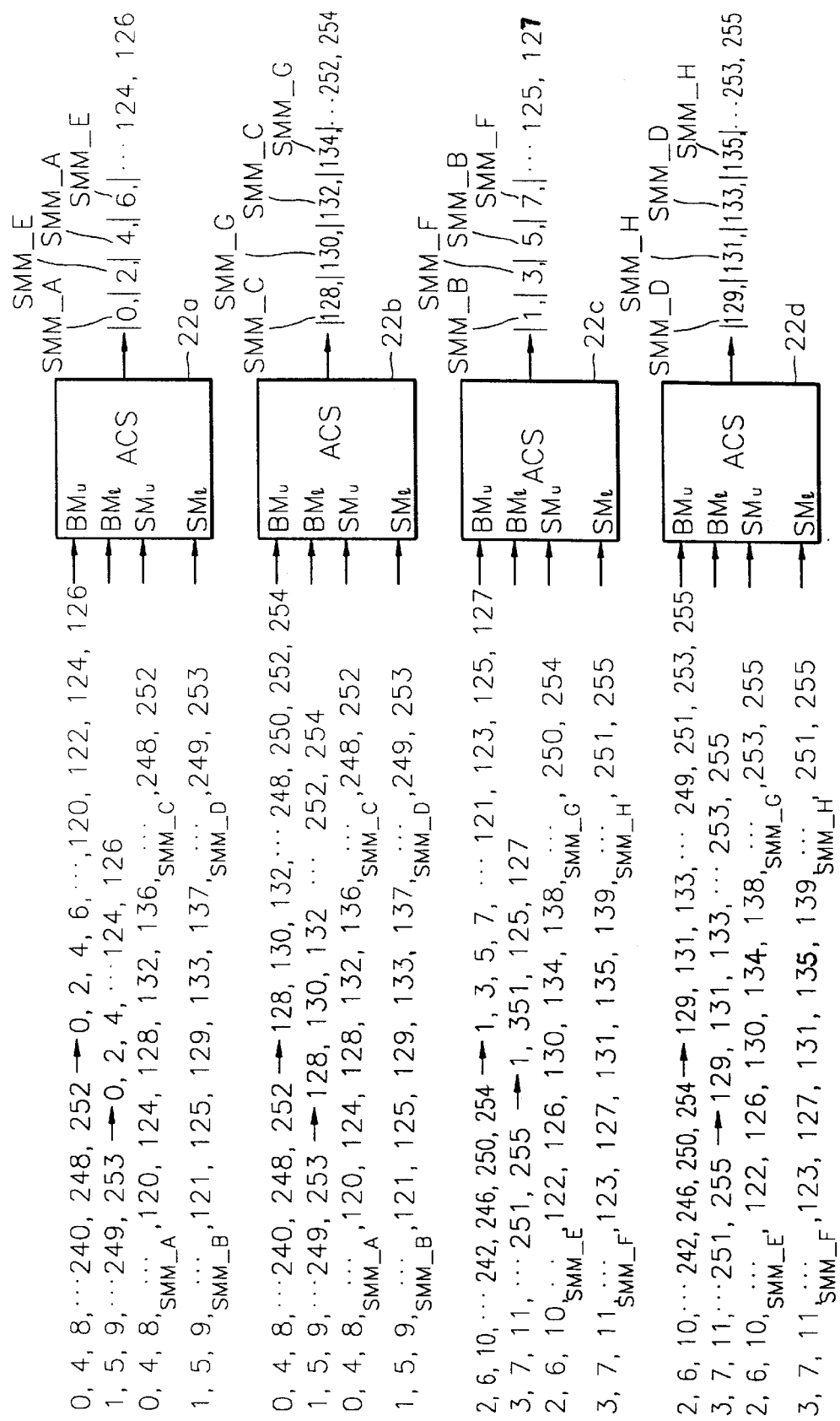
FIG. 6 shows the operation of the add-compare-select portion shown in FIG. 2.

FIG. 6 shows the relationship between the input previous state metric OSM and branch metric BM input to the ACS unit 22 and the current state metric NSM output from the ACS unit 22. The previous state metric and branch metric input to the each of the ACS units 22a–22d and the output therefrom are as follows.

The previous state metric with respect to the previous 0th, 4th, 8th, . . . , 120th, 124th, 128th, 132nd, 136th, . . . , 248th and 252nd states is applied to the SMu port of the ACS unit 22a according to the preceding sequence of the operation cycle. The previous state metric with respect to the previous 1st, 5th, 9th, . . . , 121st, 125th, 129th, 133rd, 137th, . . . , 249th and 253rd states is applied to the SMl port of the ACS unit 22a. Also, the branch metric is applied to the BMu port when the 0th, 4th, 8th, . . . , 248th and 252nd states are shifted to the 0th, 2nd, 4th, . . . , 124th and 126th states, respectively. The branch metric is applied to the BMl port when the 1st, 5th, 9th, . . . , 249th and 253rd states are shifted to the 0th, 2nd, 4th, . . . , 124th and 126th states, respectively.

The previous state metric with respect to the previous 0th, 4th, 8th, . . . , 120th, 124th, 128th, 132nd, 136th, . . . , 248th and 252nd states is applied to the SMu port of the ACS unit 22b according to the preceding sequence of the operation cycle. The previous state metric with respect to the previous 1st, 5th, 9th, . . . , 121st, 125th, 129th, 133rd, 137th, . . . , 249th and 253rd states is applied to the SMl port of the ACS unit 22b. Also, the branch metric is applied to the BMu port when the 0th, 4th, 8th, 248th and 252nd states are shifted to the 128th, 130th, 132nd, . . . , 252nd and 254th states, respectively. The branch metric is applied to the BMl port when the 1st, 5th, 9th, . . . , 249th and 253rd states are shifted to the 128th, 130th, 132nd, . . . , 252nd and 254th states, respectively.

The previous state metric with respect to the previous 2nd, 6th, 10th, . . . , 122nd, 126th, 130th, 134th, 138th, . . . , 250th and 254th states is applied to the SMu port of the ACS unit 22c according to the preceding sequence of the operation cycle. The previous state metric with respect to the previous 3rd, 7th, 11th, . . . , 251st, and 255th states is applied to the SMl port of the ACS unit 22c. Also, the branch metric is applied to the BMu port when the 2nd, 6th, 10th, . . . , 250th and 254th states are shifted to the 1st, 3rd, 5th, . . . , 125th and 127th states, respectively. The branch metric is applied to the BMl port when the 3rd, 7th, 11th, . . . , 251st and 255th states are shifted to the 1st, 3rd, 5th, . . . , 125th and 127th states, respectively.

The previous state metric with respect to the previous 2nd, 6th, 10th, . . . , 122nd, 126th, 130th, 134th, 138th, . . . , 250th and 254th states is applied to the SMu port of the ACS unit 22d according to the preceding sequence of the operation cycle. The previous state metric with respect to the previous 3rd, 7th, 11th, . . . , 123rd, 127th, 131st, 135th, 139th, . . . , 251st and 255th states is applied to the SMl port of the ACS unit 22d. Also, the branch metric is applied to the BMu port when the 2nd, 6th, 10th, . . . , 250th and 254th states are shifted to the 129th, 131st, 133rd, . . . , 253rd and 255th states, respectively. The branch metric is applied to the BMl port when the 3rd, 7th, 11th, . . . , 251st and 255th states are shifted to the 129th, 131st, 133rd, . . . , 253rd and 255th states, respectively.

The ACS unit 22a outputs the current state metrics with respect to the 0th, 2nd, 4th, 6th, . . . , 124th and 126th states, respectively, according to the preceding sequence of the operation cycle. The ACS unit 22b outputs the current state metrics with respect to the 128th, 130th, 132nd, 134th, . . . , 252nd and 254th states, respectively. The ACS unit 22c outputs the current state metrics with respect to the 1st, 3rd, 5th, 7th, . . . , 125th and 127th states, respectively. The ACS unit 22d outputs the current state metrics with respect to the 129th, 131st, 133rd, 135th, . . . , 253rd and 255th states, respectively.

A designated previous state metric must be provided at each cycle in order for the ACS unit 22 to operate normally. This is performed by the state metric memory 28 shown in FIG. 2. The state metric memory 28 shown in FIG. 2. includes two memories 28a and 28b, a multiplexer 28c and a control signal and address generator 28d.

The two memories 28a and 28b repeat a read/write operation alternately whenever a single codeword is input. For example, if a single codeword is input, the state metric memory in the memory 28a is read and the result is applied to the ACS unit 22 as a previous state metric. A current state metric newly generated by the ACS unit 22 is stored in the other memory 28b.

When the next codeword is input, the state metric memory in the memory 28b is read and the result is applied to the ACS unit 22 as a previous state metric. A current state metric newly generated by the ACS unit 22 is stored in the other memory 28a.

As described above, since the two memories perform a read/write operation alternately whenever a codeword is input, the read and write operation can be performed simultaneously. Thus, a decoding operation can be performed quickly and efficiently.

The reading operations of the memories 28a and 28b will be described below. As shown in FIG. 7, the memories 28a and 28b include eight memory banks SMM_A–SMM_H. The memory bank SMM_A stores the state metric with respect to the 0th, 4th, 8th, . . . , 120th and 124th states. The memory bank SMM_B stores the state metric with respect to the 1st, 5th, 9th, . . . , 121st and 125th states. The memory bank SMM_C stores the state metric with respect to the 128th, 132nd, 136th, . . . , 248th and 252nd states. The memory bank SMM_D stores the state metric with respect to the 129th, 133rd, 137th, . . . , 249th and 253rd states. The memory bank SMM_E stores the state metric with respect to the 2nd, 6th, 10th, . . . , 122nd and 126th states. The memory bank SMM_F stores the state metric with respect to the 3rd, 7th, 11th, . . . , 123rd and 127th states. The memory bank SMM_G stores the state metric with respect to the 130th, 134th, 138th, . . . , 250th and 254th states. The memory bank SMM-H stores the state metric with respect to the 131st, 135th, 139th, . . . , 251st and 255th states.

During the first 32 of the 64 cycles, the state metrics stored in the memory banks SMM_A and SMM_B are applied to the ACS units 22a and 22b, and the state metrics stored in the memory banks SMM_E and SMM_F are applied to the ACS units 22c and 22d.

During the next 32 cycles, the state metrics stored in the memory banks SMM_C and SMM_D are applied to the ACS units 22a and 22b, and the state metrics stored in the memory banks SMM_G and SMM_H are applied to the ACS units 22c and 22d.

The control signal and address generator 28d applies a read address to a respective ACS unit so that during the first 32 cycles, the state metrics stored in the memory banks SMM_A and SMM_B are applied to the ACS units 22a and 22b, and the state metrics stored in the memory banks SMM_E and SMM_F are applied to the ACS units 22c and 22d.

Then, the control signal and address generator 28d applies a read address to a respective ACS unit so that during the next 32 cycles, the state metrics stored in the memory banks SMM_C and SMM_D are applied to the ACS units 22a and 22b, and the state metrics stored in the memory banks SMM_G and SMM_H are applied to the ACS units 22c and 22d.

The control signal and address generator 28d applies a control signal to the multiplexer 28c so that a state metric read from one of the memories is applied to the ACS unit 22 whenever a codeword is input.

Next, the writing operation of the memories will be described below. As can be seen from FIG. 6, the ACS unit 22a performs the output operation in a sequence of 0th, 2nd, 4th, 6th, . . . , 124th and 126th states, and repeats the operation in a sequence of SMM_A, SMM_E, SMM_A, SMM_E, . . . The ACS unit 22b performs the output operation in a sequence of 128th, 130th, 132nd, 134th, . . . , 252nd and 254th states, and repeats the operation in a sequence of SMM_C, SMM_G, SMM_C, SMM_G, . . . The ACS unit 22c performs the output operation in a sequence of 1st, 3rd, 5th, 7th, . . . , 125th and 127th states, and repeats the operation in a sequence of SMM_B, SMM_F, SMM_B, SMM_F. . . . The ACS unit 22d performs the output operation in a sequence of 129th, 131st, 133rd, 135th, . . . , 253rd and 255th states, and repeats the operation in a sequence of SMM_D, SMM_H, SMM_D, SMM_H . . . , The control signal and address generator 28d generates an address so that during the odd-numbered cycles, a new state metric is stored in the memory banks of SMM_A, SMM_C, SMM_B and SMM_D, and during the even-numbered cycles, a new state metric is stored in the memory banks of SMM_E, SMM_G, SMM_F and SMM_H.

In the FIG. 2 apparatus, decoding speed can be enhanced by storing the previous state metric and the newly generated current state metric in each memory and alternately performing a read and write operation whenever a codeword is input. However, excess memory capacity is consumed by storing the state metrics. Furthermore, since the memory capacity of the state metric memory reaches two times the number of states N, the problem gets larger as the number of the states increases.

Figure 8:
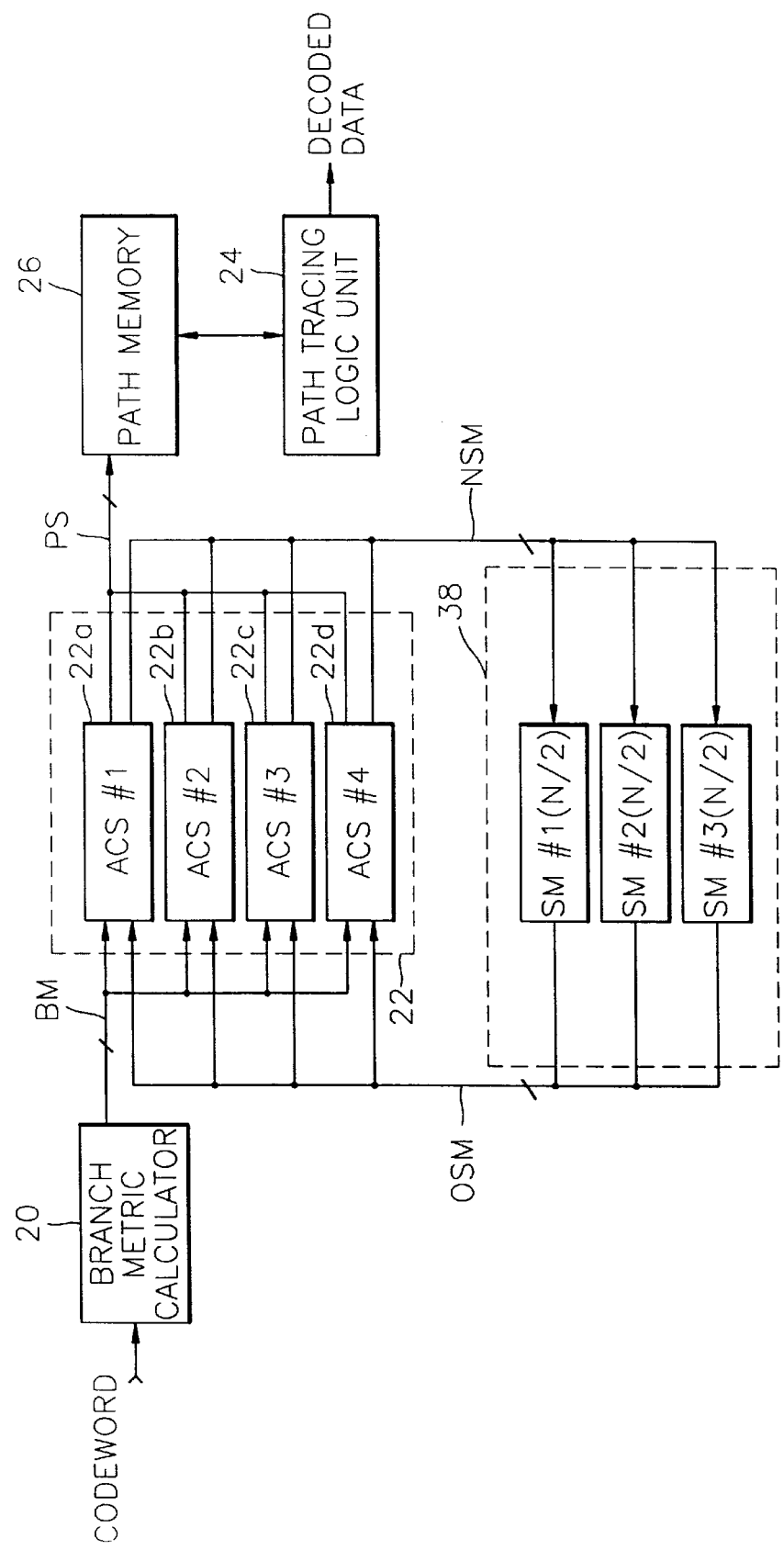
FIG. 8 is a block diagram of a Viterbi decoder according to the present invention.
Figure 9:
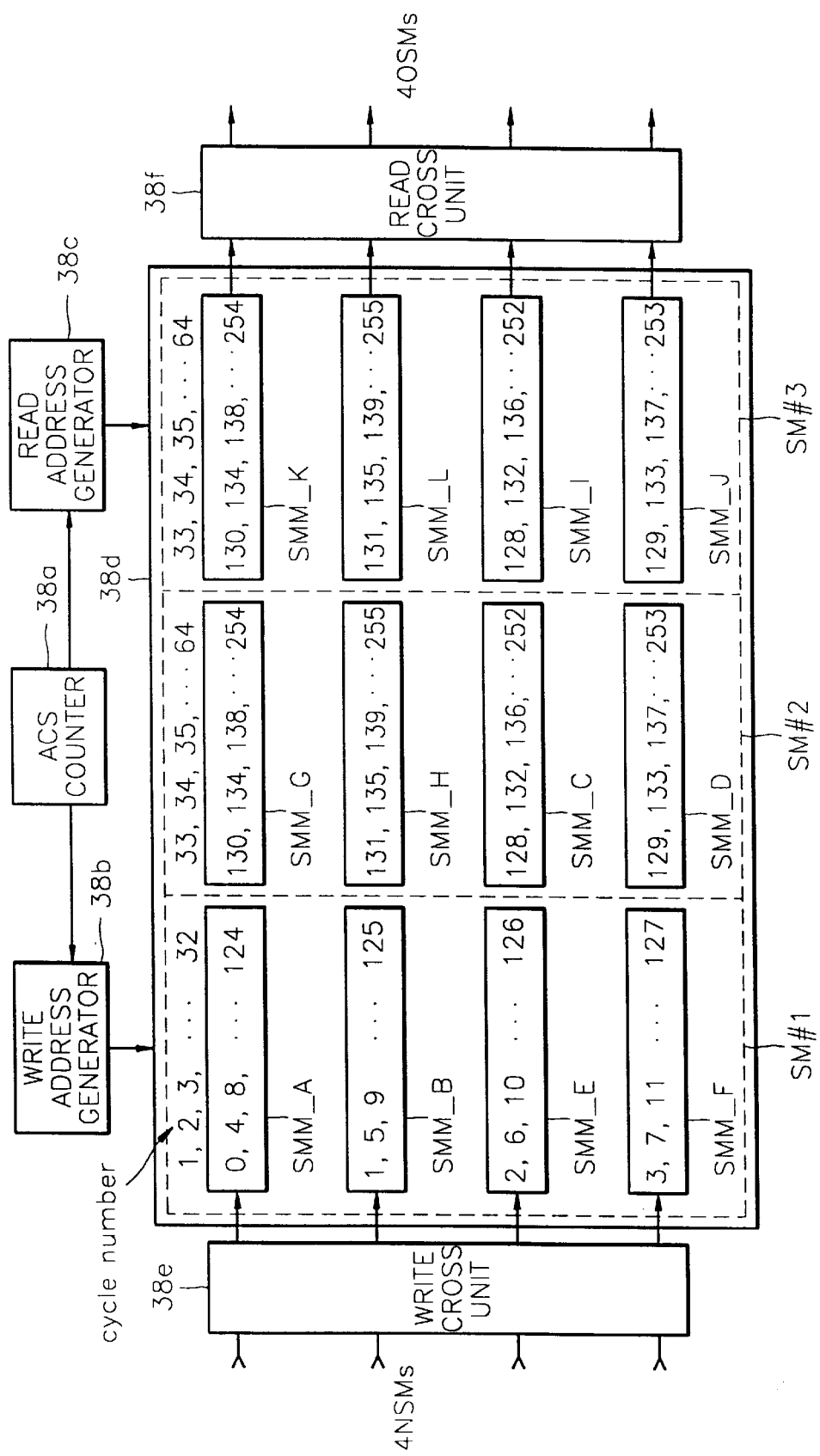
FIG. 9 is a detailed block diagram showing the state metric storing portion shown in FIG. 8.

FIG. 8 is a block diagram showing a Viterbi decoder including a state metric memory according to the present invention. In the FIG. 8 apparatus, the same reference numerals are assigned to the same elements as those of FIG. 2. The operation of these elements is the same as the apparatus in FIG. 2, therefore a detailed description will not be provided here. The most distinctive characteristic of the state metric memory 38 shown in FIG. 9 is the use of a two-port memory to reduce a storage capacity. It is well known that a two-port memory can perform reading and writing operations with respect to the same storage location at a single clock pulse. This differs from a conventional RAM. That is, data of the designated storage location is read at the rising edge of the clock and output via a read data bus, and data loaded in the write data bus is written to a designated storage location at the falling edge of the clock. As described above, since a reading and writing operation can be performed in the same storage location, the memory capacity of the state metric memory can be reduced.

However, if the memory bank structure shown in FIG. 7 is used without modification, a normal read and write operation cannot be performed as explained below. The state metric with respect to the 128th–191st states is generated for the first 32 cycles of the 64 cycles as shown in FIGS. 3A and 3B. When the generated state metric is recorded in the storage location in which the state metric with respect to the 128th–191st states is stored, they cannot be referred to during the next 32 cycles. In more detail, since the state metric generated during the first 32 cycles is the state metric with respect to the new state, and the state metric required by the ACS unit 22 is the state metric with respect to the previous state, the state metric with respect to the previous 128th–191st states cannot be used during the next 32 cycles when the state metric with respect to the 128th–191st states generated during the first 32 cycles is recorded in the same location. This creates a problem.

The present invention solves this problem by using a two-port memory. In the two-port memory, a memory bank with respect to the first half state and two memory banks with respect to the second half state are installed. The memory bank with respect to the first half state can perform a read and write operation simultaneously, and the two memory banks with respect to the second half state can perform a read and write operation alternately. That is, during the time when one memory bank performs a read operation, the other memory bank performs a write operation, which is alternately performed whenever a codeword is input.

FIG. 9 is a detailed block diagram showing the state metric memory shown in FIG. 8. As shown in FIG. 9, the state metric memory includes an ACS counter 38a, a write address generator 38b, a read address generator 38c, a two-port memory 38d, a write cross unit 38e, and a read cross unit 38f.

The ACS counter 38a performs a counting operation sequentially for 64 cycles. The write address generator 38b generates a write address of the memory 38d based on the count result of the ACS counter 38a. The read address generator 38c generates a read address of the memory 38d based on the count result of the ACS counter 38a.

The write cross unit 38e changes a sequence of the state metric, which is written in the memory 38d, based on the structure of the ACS unit 22. The read cross unit 38f changes a sequence of the state metric, which is read from the memory 38d, based on the structure of the ACS unit 22.

A read operation of the memory 38d will be described below. The memory 38d is comprised of 12 memory banks SMM_A through SMM_L as shown in FIG. 9. The memory bank SMM_A stores the state metric with respect to the 0th, 4th, 8th, . . . , 120th and 124th states. The memory bank SMM_B stores the state metric with respect to the 1st, 5th, 9th, . . . , 121st and 125th states. The memory bank SMM_E stores the state metric with respect to the 2nd, 6th, 10th, . . . , 122nd and 126th states. The memory bank SMM_F stores the state metric with respect to the 3rd, 7th, 11th, 123rd and 127th states.

The memory banks SMM_C and SMM_I store the state metric with respect to the 128th, 132nd, 136th, . . . , 248th and 252nd states. The memory banks SMM_D and SMM_J store the state metric with respect to the 129th, 133rd, 137th, . . . , 249th and 253th states. The memory banks SMM_G and SMM_K store the state metric with respect to the 130th, 134th, 138th, . . . , 250th and 254th states. The memory banks SMM_H and SMM_L store the state metric with respect to the 131st, 135th, 139th, . . . , 251st and 255th states.

During the first 32 of the 64 cycles, the state metrics stored in the memory banks SMM_A and SMM_B are applied to the ACS units 22a and 22b, and the state metrics stored in the memory banks SMM_E and SMM_F are applied to the ACS units 22c and 22d.

During the next 32 cycles, the state metrics stored in the memory banks SMM_C and SMM_D are applied to the ACS units 22a and 22b, and the state metrics stored in the memory banks SMM_G and SMM_H are applied to the ACS units 22c and 22d.

During the first 32 of the 64 cycles, the read address generator 38c applies a read address to a respective ACS unit so that the state metrics stored in the memory banks SMM_A and SMM_B are applied to the ACS units 22a and 22b, and the state metrics stored in the memory banks SMM_E and SMM_F are applied to the ACS units 22c and 22d.

Then, during the next 32 cycles, the read address generator 38c applies a read address to a respective ACS unit so that the state metrics stored in the memory banks SMM_C and SMM_D are applied to the ACS units 22a and 22b, and the state metrics stored in the memory banks SMM_G and SMM_H are applied to the ACS units 22c and 22d.

When the next codeword is input, during the first 32 of the 64 cycles, the read address generator 38c applies a read address to a respective ACS unit so that the state metrics stored in the memory banks SMM_A and SMM_B are applied to the ACS units 22a and 22b, and the state metrics stored in the memory banks SMM_E and SMM_F are applied to the ACS units 22c and 22d.

Then, during the next 32 cycles, the read address generator 38c applies a read address to a respective ACS unit so that the state metrics stored in the memory banks SMM_I and SMM_J are applied to the ACS units 22a and 22b, and the state metrics stored in the memory banks SMM_K and SMM_L are applied to the ACS units 22c and 22d.

Next, a write operation of the memory will be described below. If a certain codeword is input, the write address generator 38b generates a write address of the memory banks SMM_A, SMM_B, SMM_E, SMM_F, SMM_I, SMM_J, SMM_K, and SMM_L. When the next codeword is input, the write address generator 38b generates a write address of the memory banks SMM_A, SMM_B, SMM_E, SMM_F, SMM_C, SMM_D, SMM_G, and SMM_H.

Accordingly, the memory banks SMM_A, SMM_B, SMM_E and SMM_F are used whenever each codeword is input. However, the memory banks SMM_C, SMM_D, SMM_G and SMM_H, and the memory banks SMM_I, SMM_J, SMM_K and SMM_L perform a read and write operation alternately.

As described above, the embodiment of the present invention that has been described refers to the use of four ACS units. It is noted that the present invention can be applied without any modification when $2^n$ (wherein n is 1, 2, . . . ) ACS units are used. In those cases, each memory is divided into as many memory banks as the number of the ACS units.

As described above, the apparatus according to the present invention reduces the memory capacity for storing the state metric by using a two-port memory.

Also, the apparatus according to the present invention incorporates a single memory unit that divides the memory structure into one memory bank for the first half state and two memory banks for the second half state. Misoperation can be prevented by enabling one memory bank for the first half state to a simultaneously perform a read and write operation, and enabling the two memory banks to alternately perform a read and write operation by a codeword. The number of memories is equal to the number of the ACS units.

In the conventional prior art, a memory capacity of two times the state number information amount is required, and the memory is divided into four times as many memories as the number of the ACS units, for the purpose of storing the state metrics. When the apparatus according to the present invention is used, the memory capacity is only 1.5 times the state metrics, and the memory is divided into the number of the ACS units. Accordingly, the manufacturing cost of the Viterbi decoder can be greatly reduced.

What is claimed is:

1. A Viterbi decoder comprising:

a branch metric calculator for calculating a similarity between an input codeword and a predetermined codeword which can be output from an encoder and outputting 2N branch metrics where N is the number of states;

an add-compare-select (ACS) portion for performing an add-compare operation by receiving 2N branch metrics and N previous state metrics provided from the branch metric calculator, selecting a survival path showing an encoding sequence closest to that of the received codeword, and calculating N current state metrics;

and a state metric memory for providing the N previous state metrics to the ACS unit or storing the N current state metrics generated by the ACS unit; wherein said ACS unit comprises M ACS units each of which perform N/M operations during N/M cycles whenever a codeword is input; and said state metric memory comprises:

a memory including a memory bank for reading and writing a state metric of the first half among the N state metrics generated in said ACS unit, and two memory banks for alternately reading and writing the state metrics of the second half whenever a codeword is input;

a counter for counting a preceding sequence of said cycles;

a write address generator for generating a write address of said memory based on the count result of said counter; and a read address generator for generating a read address of said memory based on the count result of said counter.

2. The Viterbi decoder of claim 1, wherein said memory is a two-port memory.

3. The Viterbi decoder of claim 1, wherein said state metric memory further comprises a write cross unit for realigning the state metrics which are written to the memory according to the structure of said ACS unit.

4. The Viterbi decoder of claim 1, wherein said state metric memory further comprises a read cross unit for realigning the state metrics which are read from the memory according to the structure of said ACS unit.

* * * * *